(12) United States Patent
Hikita et al.

(10) Patent No.: US 6,657,309 B1
(45) Date of Patent: Dec. 2, 2003

(54) SEMICONDUCTOR CHIP AND SEMICONDUCTOR DEVICE OF CHIP-ON-CHIP STRUCTURE

(75) Inventors: Junichi Hikita, Kyoto (JP); Katsumi Sameshima, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/499,580

(22) Filed: Feb. 7, 2000

(30) Foreign Application Priority Data

Feb. 8, 1999 (JP) .......................................... 11-029843
Feb. 8, 1999 (JP) .......................................... 11-029844

(51) Int. Cl.[7] .................. H01L 23/48; H01L 23/52; H01L 29/40

(52) U.S. Cl. ................... 257/774; 257/777; 257/748; 257/784

(58) Field of Search ................ 257/774, 777, 257/778, 784, 737, 748, 750, 788

(56) References Cited

U.S. PATENT DOCUMENTS

| | | | | |
|---|---|---|---|---|
| 5,202,754 A | * | 4/1993 | Bertin et al. ................ | 257/684 |
| 5,729,896 A | * | 3/1998 | Dalal et al. .................... | 29/840 |
| 5,801,446 A | * | 9/1998 | DiStefano et al. .......... | 257/778 |
| 5,854,514 A | * | 12/1998 | Roldan et al. .............. | 257/746 |
| 5,872,404 A | * | 2/1999 | Lynch et al. ................ | 257/781 |
| 5,892,287 A | * | 4/1999 | Hoffman et al. ............. | 257/777 |
| 5,925,931 A | * | 7/1999 | Yamamoto ................... | 257/737 |
| 6,133,637 A | * | 10/2000 | Hikata et al. ................ | 257/777 |

FOREIGN PATENT DOCUMENTS

| | | |
|---|---|---|
| JP | 64-39041 | 2/1989 |
| JP | 2-90637 | 3/1990 |
| JP | 2-142134 | 5/1990 |
| JP | 4-42957 | 2/1992 |
| JP | 6-163547 | 6/1994 |
| JP | 8-78410 | 3/1996 |
| JP | 10-284755 | 10/1998 |
| JP | 10-303252 | 11/1998 |

OTHER PUBLICATIONS

Articles; pp 83–92; Nikkei Electronics (Jul. 1991).

* cited by examiner

Primary Examiner—Elvin Enad
Assistant Examiner—K. Lee
(74) Attorney, Agent, or Firm—Rader, Fishman & Grauer PLLC

(57) ABSTRACT

A semiconductor chip having a semiconductor substrate; a surface protective film covering the semiconductor substrate; and an interconnection having a portion exposed on the surface protective film, at least the exposed portion of the interconnection being composed of an oxidation-resistant metal material. The interconnection includes, for example, an internal interconnection at least partly exposed from the surface protective film, and a metal coating film of the oxidation-resistant metal material covering a surface portion of the internal interconnection exposed from the surface protective film. The interconnection may be a surface interconnection of the oxidation-resistant metal material provided on the surface protective film.

5 Claims, 7 Drawing Sheets

SEMICONDUCTOR CHIP AND SEMICONDUCTOR DEVICE OF CHIP-ON-CHIP STRUCTURE

BACKGROUND OF THE INVENTION

1. Field of the Invention

The present invention relates to semiconductor chips and semiconductor devices of chip-on-chip structure in which semiconductor chips are bonded to each other in a stacked relation.

2. Description of Related Art

In general, interconnections provided in a semiconductor chip are composed of alloys such as of aluminum and copper for cost reduction. The interconnections of aluminum/copper-based alloy are susceptible to oxidation due to humidity. In this respect, a surface of an insulating film formed with the interconnections is covered with a surface protective film such as of silicon nitride.

For connection of the interconnections to a lead frame, portions of the interconnections are exposed from the surface protective film by forming openings in the surface protective film, and the exposed portions are connected to external terminals by lead-bonding with the use of Au (gold) wires. By the lead-bonding, pad surfaces are covered with end portions of the Au wires.

However, if the portions of the interconnections exposed through the openings of the surface protective film are partly left uncovered due to unsatisfactory lead bonding, the uncovered portions are liable to be oxidized and corroded by moisture.

In the case of semiconductor chips to be applied to a semiconductor device of chip-on-chip structure, for example, pad openings are formed in a surface thereof for partly exposing internal interconnections thereof. Bumps are provided on portions of the internal interconnections exposed through the pad openings. The internal interconnections of one of the semiconductor chips are electrically connected to the internal interconnections of the other semiconductor chip by bonding the opposed bumps of the respective semiconductor chips to each other. In this case, if the bumps are connected to the pad openings in an offset relation, the interconnections are partly exposed, and the exposed interconnection portions are susceptible to oxidation.

Another problem associated with the conventional semiconductor chips is that the interconnections generally have a reduced thickness for reduction of the chip thickness thereby to have a greater wiring resistance.

In the semiconductor chips for the semiconductor device of chip-on-chip structure, the pad openings for partly exposing the internal interconnections should be located in association with the bumps of the opposed semiconductor chip. That is, it is impossible to form the pad openings in positions independent of the positions of the bumps of the opposed semiconductor chip. This poses limitations on flexibility in layout of the interconnections and functional devices, thereby hindering further size reduction and integration of the semiconductor device.

SUMMARY OF THE INVENTION

It is a first object of the present invention to provide a semiconductor chip and a semiconductor device of chip-on-chip structure which are constructed so that interconnections thereof can be protected from corrosion.

It is a second object of the present invention to provide a semiconductor chip which features a reduced wiring resistance.

It is a third object of the present invention to provide a semiconductor device of chip-on-chip structure and a semiconductor chip which feature an increased flexibility in layout of pad openings for size reduction and higher integration thereof.

The semiconductor chip according to the present invention comprises: a semiconductor substrate; a surface protective film covering the semiconductor substrate; and an interconnection having a portion exposed on the surface protective film, at least the exposed portion of the interconnection being composed of an oxidation-resistant metal material.

The oxidation-resistant metal material is a material which is more oxidation-resistant than the other unexposed portion of the interconnection.

The interconnection may comprise an internal interconnection at least partly exposed from the surface protective film, and a metal coating film of the oxidation-resistant metal material covering a surface portion of the internal interconnection exposed from the surface protective film.

With this arrangement, the surface portion of the internal interconnection is covered with the metal coating film of the metal material which is more oxidation-resistant than the internal interconnection, so that the internal interconnection is not susceptible to corrosion due to oxidation thereof. The metal coating film covering the surface portion of the internal interconnection also serves to carry an electric current, so that the interconnection totally have a reduced resistance with a greater cross sectional area.

The internal interconnection may be exposed from the surface protective film through an opening formed in the surface protective film. In this case, the metal coating film preferably covers a surface of the internal interconnection exposed from the surface protective film through the opening.

With this arrangement, the surface of the interconnection exposed through the opening is covered with the metal coating film thereby to be insusceptible to corrosion due to oxidation thereof.

It is noted that the opening may be formed so that the surface of the interconnection is exposed either entirely or partly.

The internal interconnection may have an exposed surface which is flush with a surface of the surface protective film, and the metal coating film may cover the exposed surface of the internal interconnection.

In this case, the exposed surface of the internal interconnection which is flush with the surface protective film may be formed by covering the internal interconnection with the surface protective film and then polishing the surface protective film for planarization thereof.

With this arrangement, the surface protective film is planarized, so that the metal coating film which covers the surface of the internal interconnection exposed from the surface protective film can advantageously be formed by patterning through the photolithography technique.

The internal interconnection may project from the surface of the surface protective film. In this case, the metal coating film preferably covers surfaces (upper and side surfaces) of the internal interconnection projecting from the surface protective film.

With this arrangement, the surfaces of the internal interconnection projecting from the surface protective film are covered with the metal coating film. Therefore, there is no need to provide a protective film for protecting the interconnection even if the internal interconnection projects from the surface protective film.

The interconnection may be a surface interconnection of the oxidation-resistant metal material provided on the surface protective film.

In this case, the surface protective film may cover an internal interconnection and be formed with a pad opening for partly exposing the internal interconnection. Further, the surface interconnection may electrically be connected to the internal interconnection through the pad opening.

Where the semiconductor chip having the aforesaid construction is applied to a semiconductor device of chip-on-chip structure, electrical connection between the semiconductor chips can be achieved by bonding the surface interconnection of the semiconductor chip to a bump or the like of the opposed semiconductor chip. Thus, formation of the pad opening can be achieved without consideration of the position of the bump on the opposed semiconductor chip. This increases flexibility in layout of interconnections and functional devices, thereby allowing for size reduction and higher integration of the semiconductor chip.

Further, there is no need to give a consideration to the corrosion of the surface interconnection due to oxidation because the surface interconnection is composed of the oxidation-resistant metal material. Therefore, the need for formation of a protective film for protection of the surface interconnection is obviated. Accordingly, the semiconductor chip can be produced through a reduced number of process steps as compared with a case where a multi-level interconnection structure is employed to provide an increased number of internal interconnections. That is, the surface interconnection can be used in place of one of the internal interconnections of the multi-level interconnection structure.

The semiconductor chip may further comprise a bump formed by depositing a seed film on the surface of the surface protective film formed with the pad opening and selectively plating a portion of the seed film in the pad opening. In this case, the surface interconnection may be formed by patterning the seed film.

With this arrangement, the formation of the surface interconnection can be achieved by selectively removing the seed film for patterning thereof, for example, after the bump is formed by utilizing part of the seed film. Therefore, there is no need to separately prepare the material for the surface interconnection. Thus, a cost increase due to the provision of the surface interconnection can be suppressed.

The surface interconnection and the bump are preferably composed of the same material. This permits the surface interconnection and the bump to be formed in the same process step, thereby simplifying the production process.

The semiconductor device of chip-on-chip structure according to the present invention comprises: a first semiconductor chip which includes an interconnection having a portion exposed from a surface protective film thereof, at least the exposed portion of the interconnection being composed of an oxidation-resistant metal material; and a second semiconductor chip stacked on the first semiconductor chip and bonded to a surface of the first semiconductor chip, the second semiconductor chip having an inter-chip connector (interconnection connector) provided in a surface thereof opposed to the first semiconductor chip and electrically connected to an internal interconnection thereof. The interconnection of the first semiconductor chip is connected to the inter-chip connector of the second semiconductor chip for electrical connection between the first and second semiconductor chips.

The inter-chip connector may be a bump or a surface interconnection provided on an exposed portion of the internal interconnection of the second semiconductor chip. The interconnection of the first semiconductor chip may include an internal interconnection at least partly exposed from the surface protective film, and a metal coating film of the oxidation-resistant metal material covering a surface portion of the internal interconnection exposed from the surface protective film.

With this arrangement, the exposed portion of the internal interconnection of the first semiconductor chip is covered with the metal coating film, and the bump is provided on the exposed portion of the interconnection of the second semiconductor chip. Therefore, the interconnections of the first and second semiconductor chips are not susceptible to corrosion due to oxidation thereof.

With the bump provided on the interconnection of the second semiconductor chip, there is no need for formation of a bump on the first semiconductor chip. Therefore, the step of forming the bump on the first semiconductor chip can be obviated, thereby simplifying a semiconductor device production process.

In addition, where the surface of the metal coating film is recessed with respect to the surface of the surface protective film, the metal coating film of the first semiconductor chip is boned to the bump of the second semiconductor chip in depression-projection engagement. Thus, the first semiconductor chip can properly be positioned with respect to the second semiconductor chip for proper electrical connection between the first and second semiconductor chips.

The interconnection of the first semiconductor chip may be a surface interconnection of the oxidation-resistant metal material formed on the surface protective film.

The surface protective film may cover an internal interconnection and be formed with a pad opening for partly exposing the internal interconnection. In this case, the surface interconnection is preferably electrically connected to the internal interconnection through the pad opening.

The inter-chip connector may be a surface interconnection electrically connected to the internal interconnection of the second semiconductor chip via a pad opening of the second semiconductor chip. Alternatively, the inter-chip connector may be a bump provided on a portion of the internal interconnection exposed through the pad opening of the second semiconductor chip.

The term "surface interconnection" herein means an interconnection extending on the surface of the semiconductor chip from the pad opening, and the term "bump" herein means a projection projecting above the pad opening.

With this arrangement, the first semiconductor chip and the second semiconductor chip are electrically connected to each other by connecting the surface interconnection of the first semiconductor chip and the internal interconnection of the second semiconductor chip via the inter-chip connector. In other words, the surface interconnection of the first semiconductor chip is formed by patterning so as to allow for connection between the surface interconnection and the inter-chip connector for the electrical connection between the first semiconductor chip and the second semiconductor chip. Therefore, the position of the pad opening of the first semiconductor chip can be determined irrespective of the position of the pad opening of the second semiconductor chip. This increases flexibility in layout of the internal interconnection and functional devices in the first semiconductor chip, thereby allowing for further size reduction and integration of the semiconductor device.

Where the inter-chip connector is the surface interconnection, the pad openings of the first semiconductor chip and the second semiconductor chip can be located in positions independent of the positions of the pad openings of the second semiconductor chip and the first semiconductor chip, respectively. This increases flexibility in layout of the internal interconnections and functional devices in the first and second semiconductor chips, thereby allowing for further size reduction and integration of the first and second semiconductor chips.

The foregoing and other objects, features and effects of the present invention will become more apparent from the following description of the preferred embodiments with reference to the attached drawings.

DESCRIPTION OF THE PREFERRED EMBODIMENTS

Figure 1:
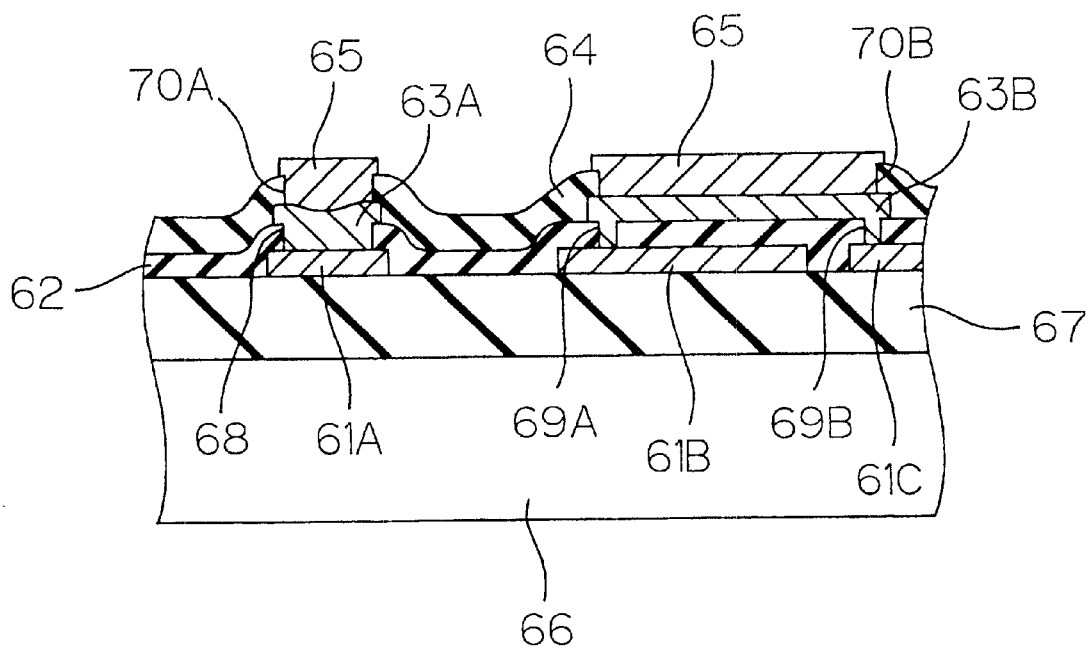
FIG. 1 is a sectional view illustrating the construction of a semiconductor chip according to a first embodiment of the present invention.

FIG. 1 is a sectional view illustrating the construction of a semiconductor chip according to a first embodiment of the present invention. The semiconductor chip has a so-called multi-level interconnection structure in which an inter-level insulating film 62 is provided on primary interconnections 61A, 61B, 61C (internal interconnections) and secondary interconnections 63A, 63B are provided on the inter-level insulating film 62. Surface portions of the secondary interconnections 63A, 63B (internal interconnections) located on the outermost side are exposed from a surface protective film 64, and the exposed surface portions are covered with metal coating films 65 of an oxidation-resistant metal. Examples of the oxidation-resistant metal include gold, platinum, silver and iridium.

More specifically, a field oxide film 67 such as of silicon oxide is provided on a silicon substrate 66 which serves as a base of the semiconductor chip. The primary interconnections 61A, 61B, 61C are provided on the field oxide film 67. The primary interconnections 61A, 61B, 61C and the field oxide film 67 are covered with the inter-level insulating film 62 having an insulative property. The inter-level insulating film 62 is formed with an opening 68 and contact holes 69A and 69B, which face the primary interconnections 61A, 61B and 61C, respectively.

The secondary interconnection 63A is connected to the primary interconnection 61A which is exposed from the inter-level insulating film 62 through the opening 68. The secondary interconnection 63B is provided on a surface portion of the inter-level insulating film 62 between the contact holes 69A and 69B. The secondary interconnection 63B is connected to the primary interconnections 61B and 61C via the contact holes 69A and 69B.

The surface protective film 64 which has an insulative property is provided on the secondary interconnections 63A, 63B and the inter-level insulating film 62. The surface protective film 64 is formed with openings 70A and 70B, which face the secondary interconnections 63A and 63B, respectively. Thus, the surface portions (upper surface portions) of the secondary interconnections 63A and 63B are exposed from the surface protective film 64 through the openings 70A and 70B, respectively.

The metal coating films 65 of the oxidation-resistant metal are respectively provided on the surface portions of the secondary interconnections 63A and 63B which face the openings 70A and 70B, respectively. Formation of the metal coating films 65 is achieved, for example, through a process which includes the steps of: forming a seed film on the secondary interconnections 63A, 63B and the surface protective film 64 by sputtering; forming a resist film on a portion of the seed film which is not located in the openings 70A, 70B; subjecting the resulting surface to plating with the use of the material for the metal coating films 65; removing the resist film on the seed film; and removing the portion of the seed film exposed as a result of the removal of the resist film.

Examples of usable materials for the primary interconnections 61A, 61B, 61C and the secondary interconnections 63A, 63B include aluminum, alloys of aluminum and silicon, alloys of aluminum, silicon and copper, alloys of aluminum and copper, and copper.

Examples of usable materials for the surface protective film 64 and the inter-level insulating film 62 include silicon oxide, silicon nitride, silicon fluoride, SiON, SiOF, and polyimides.

In the semiconductor chip according to this embodiment, as described above, the surface portions of the secondary interconnections 63A, 63B are exposed from the surface protective film 64 through the openings 70A, 70B. The exposed surface portions of the secondary interconnections 63A, 63B are coated with the metal coating films 65 of the oxidation-resistant metal. Thus, an electric current is allowed to flow through the secondary interconnections 63A, 63B as well as the metal coating films 65. A combination of the secondary interconnection 63A, 63B and the metal coating film 65 serves as a unitary interconnection which has a reduced resistance with a greater cross sectional area.

Although the surface portions of the secondary interconnections 63A, 63B are exposed from the surface protective film 64, the exposed surface portions which are covered with the metal coating films 65 of the oxidation-resistant metal are not susceptible to corrosion which may otherwise occur due to oxidation thereof.

Figure 2:
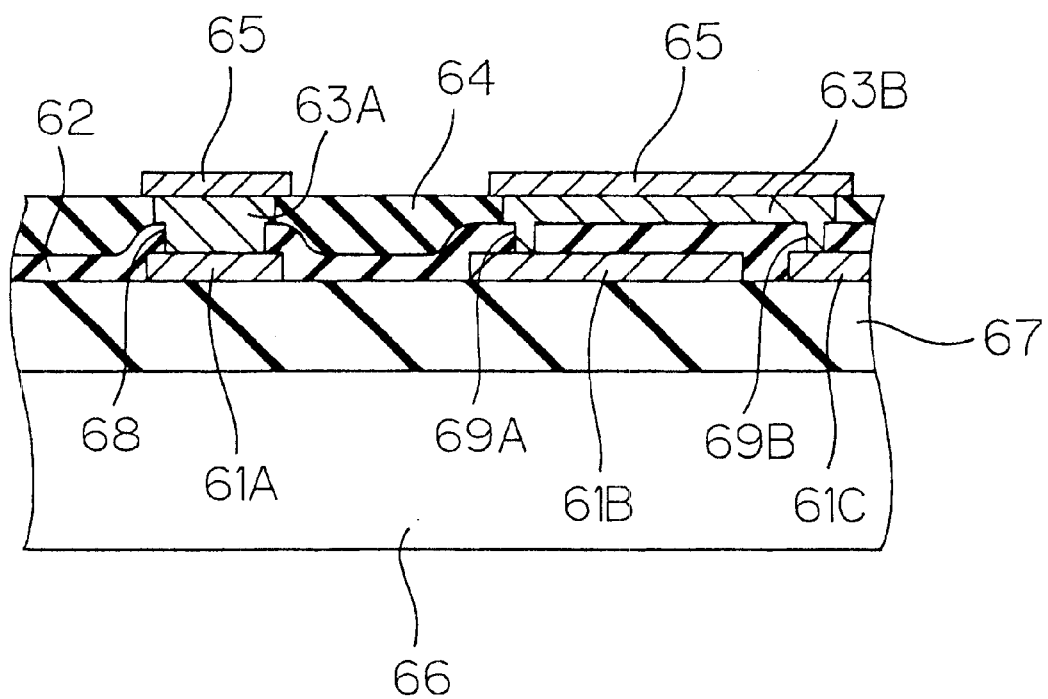
FIG. 2 is a sectional view illustrating the construction of a semiconductor chip according to a second embodiment of the present invention.

FIG. 2 is a sectional view illustrating the construction of a semiconductor chip according to a second embodiment of the present invention. In FIG. 2, components corresponding to those illustrated in FIG. 1 are denoted by the same reference characters as in FIG. 1, and differences between the first and second embodiments will mainly be explained.

In the second embodiment, the surfaces of the secondary interconnections 63A, 63B and the surface protective film 64 are planarized after the secondary interconnections 63A, 63B are covered with the surface protective film 64. Then, the metal coating films 65 are formed by subjecting the planarized surface to selective plating.

More specifically, the surface protective film 64 is deposited on the secondary interconnections 63A, 63B and the inter-level insulating film 62, and then the surface of the surface protective film 64 is polished by a CMP (chemical mechanical polishing) process for planarization. The CMP process is carried out until the surfaces of the secondary interconnections 63A, 63B are exposed to be flush with the polished surface of the surface protective film 64. Then, a seed film is formed on the exposed surfaces of the secondary interconnections 63A, 63B and the surface of the surface protective film 64 which are flush with each other. A resist pattern film is formed through the photolithography technique on a portion of the seed film which does not face the secondary interconnections 63A, 63B. After the resulting surface is subjected to plating with the use of the material for the metal coating films 65, the resist film on the seed film is removed. Further, the portion of the seed film exposed as a result of the removal of the resist film is removed. Thus, the metal coating films 65 are formed on the surfaces (exposed surfaces) of the secondary interconnections 63A, 63B.

In this embodiment, the surfaces of the secondary interconnections 63A, 63B are exposed by polishing the surface of the surface protective film 64 for planarization. This obviates the step of forming the openings in the surface protective film by patterning for exposing the secondary interconnections 63A, 63B. Since the surface of the surface protective film 64 is planarized, the formation of the resist film can advantageously be achieved through the photolithography technique. Thus, the metal coating films 65 can advantageously be formed by patterning.

Figure 3:
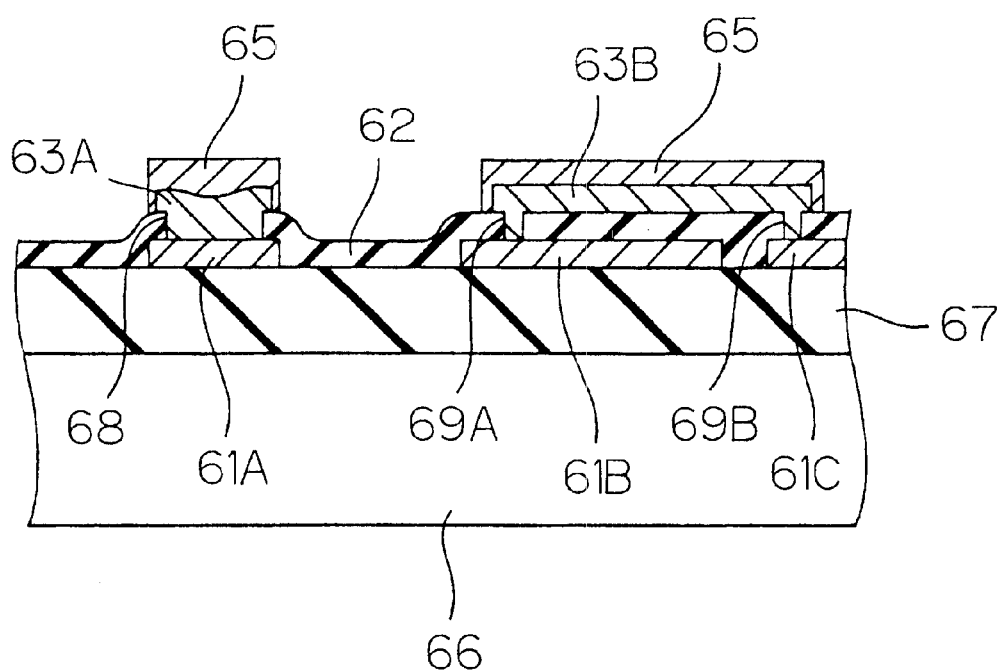
FIG. 3 is a sectional view illustrating the construction of a semiconductor chip according to a third embodiment of the present invention.

FIG. 3 is a sectional view illustrating the construction of a semiconductor chip according to a third embodiment of the present invention. In FIG. 3, components corresponding to those illustrated in FIG. 1 are denoted by the same reference characters as in FIG. 1, and differences between the first and third embodiments will mainly be explained.

The semiconductor chip according to the third embodiment does not include the surface protective film 64 shown in FIG. 1. The secondary interconnections 63A, 63B project above the inter-level insulating film 62 which virtually serves as the surface protective film, and the surfaces of the secondary interconnections 63A, 63B are covered with the metal coating films 65. For this arrangement, a seed film is formed on the secondary interconnections 63A, 63B and the inter-level insulating film 62 after the secondary interconnections 63A, 63B are formed. Then, the seed film is selectively plated with the material for the metal coating films 65. Thus, the metal coating films 65 are formed as covering the surfaces of the secondary interconnections 63A, 63B exposed from the inter-level insulating film 62.

In accordance with this embodiment, the step of forming the surface protective film 64 for protection of the exposed surfaces of the secondary interconnections 63A, 63B can be obviated, so that the number of process steps can be reduced as compared with the first embodiment.

Figure 4:
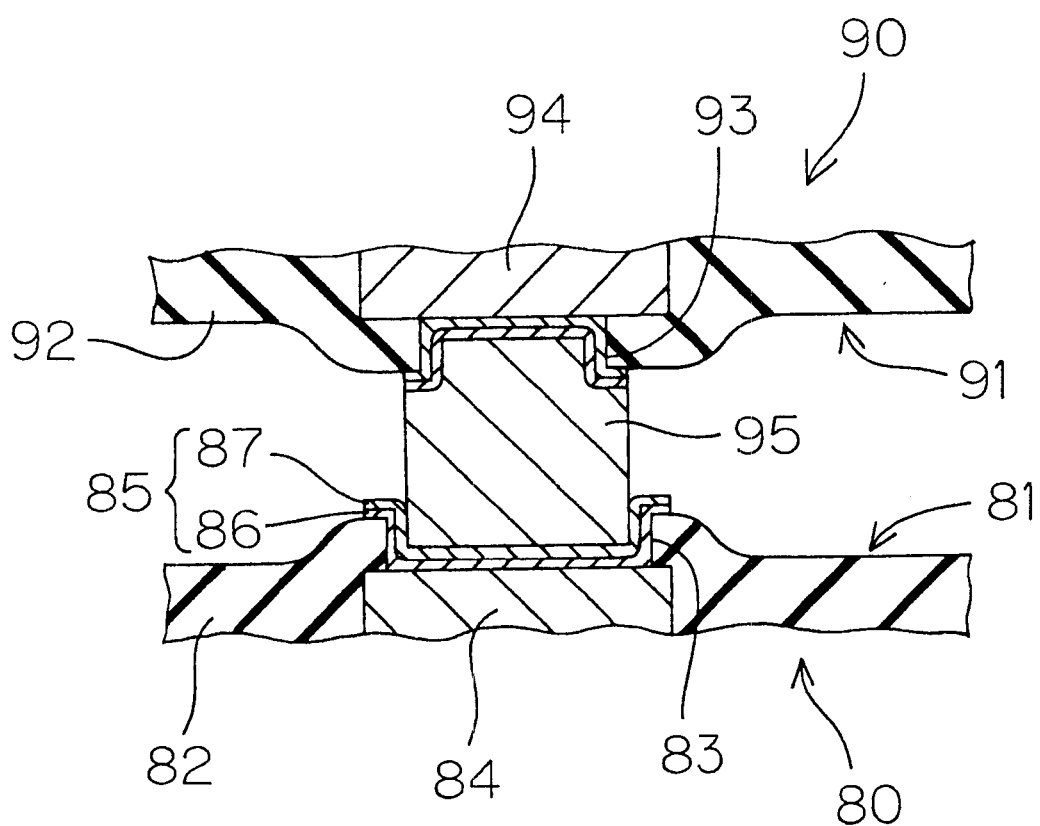
FIG. 4 is a sectional view illustrating the construction of a major portion of a semiconductor device according to a fourth embodiment of the present invention.

FIG. 4 is a sectional view illustrating the construction of a semiconductor device according to a fourth embodiment of the present invention. The semiconductor device has a so-called chip-on-chip structure, which includes a primary chip 80 as the first semiconductor chip and a secondary chip 90 as the second semiconductor chip stacked on the primary chip 80 and bonded to a surface 81 thereof.

The primary chip 80 is comprised, for example, of a silicon chip. The surface 81 of the primary chip 80 is covered with a surface protective film 82 having an insulative property. The surface protective film 82 is formed with an opening 83 which faces an interconnection 84. A metal coating film 85 of an oxidation-resistant metal (e.g., gold, platinum, silver or iridium) is provided on a surface portion of the interconnection 84 exposed from the surface protective film 82 through the opening 83. The metal coating film 85 is formed by forming a thin titanium tungsten (TiW) film 86 on the surface protective film 82 and the interconnection 84 by sputtering and then forming a thin gold (Au) film 87 on the thin titanium tungsten film 86 by sputtering.

On the other hand, the secondary chip 90 is comprised, for example, of a silicon chip, and bonded to the primary chip 80 with its surface 91 opposed to the surface 81 of the primary chip 80 by a so-called face-down method. The surface 91 of the secondary chip 90 is covered with a surface protective film 92 having an insulative property. The surface protective film 92 is formed with an opening 93 which faces an interconnection 94. The opening 93 is formed in a position which is determined in consideration of the position of the opening 83 of the primary chip 80. A bump 95 (inter-chip connector, interconnection connector) of an oxidation-resistant metal is provided on a surface portion of the interconnection 94 exposed from the surface protective film 92 through the opening 93.

With the primary chip 80 being joined with the secondary chip 90, a distal end of the bump 95 is fitted in the opening 83 formed in the primary chip 80, so that the bump 95 is bonded to the metal coating film 85 in projection-depression engagement. Thus, the secondary chip 90 is electrically connected to the primary chip 80 in a predetermined spaced relation with respect to the surface 81 of the primary chip 80.

In accordance with this embodiment, as described above, the surface portion of the interconnection 84 of the primary chip 80 exposed from the surface protective film 82 is covered with the metal coating film 85. Further, the bump 95 is provided on the surface portion of the interconnection 94 of the secondary chip 90 exposed from the surface protective film 92. Therefore, the interconnection 84 of the primary chip 80 and the interconnection 94 of the secondary chip 90 are not susceptible to corrosion which may otherwise occur due to oxidation thereof.

When the secondary chip 90 is bonded to the primary chip 80, the distal end of the bump 95 is fitted in the opening 83 of the primary chip 80 for projection-depression engagement, so that the secondary chip 90 can properly be positioned with respect to the primary chip 80 for proper electrical connection between the primary chip 80 and the secondary chip 90.

Examples of usable materials for the surface protective films 82, 92 include silicon oxide, silicon nitride, SiON, and silicon fluoride.

Examples of usable materials for the interconnections 84, 94 include aluminum, alloys of aluminum and silicon, alloys of aluminum, silicon and copper, alloys of aluminum and copper, and copper.

Figure 5:
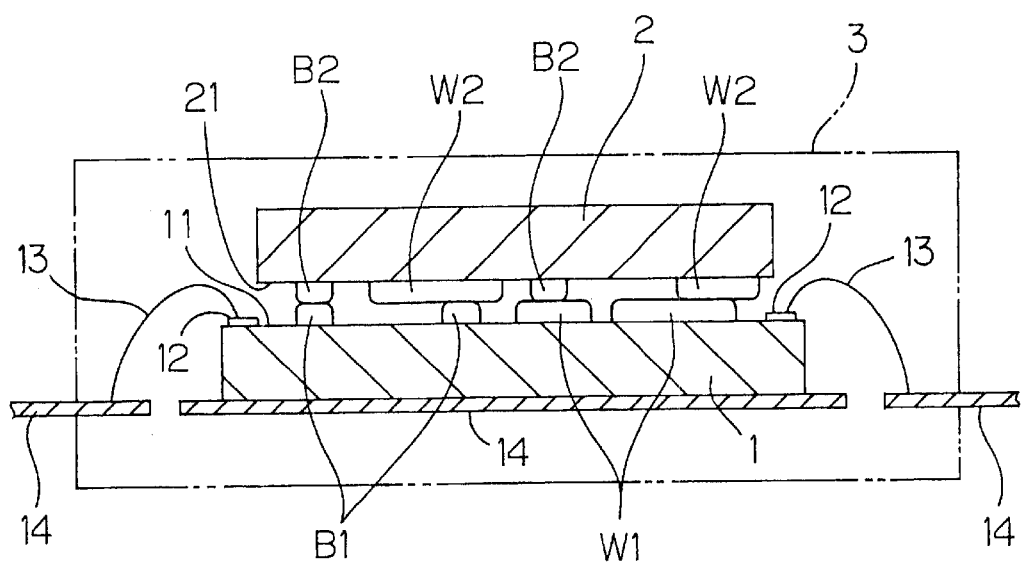
FIG. 5 is a schematic sectional view illustrating the construction of a semiconductor device according to a fifth embodiment of the present invention.

FIG. 5 is a schematic sectional view illustrating the construction of a semiconductor device according to a fifth embodiment of the present invention. The semiconductor device has a so-called chip-on-chip structure. The semiconductor device is produced by stacking and bonding a daughter chip or secondary chip 2 on a surface 11 of a mother chip or primary chip 1, and then packaging these chips in a package 3 of sealing resin.

The primary chip 1 is comprised, for example, of a silicon chip. The surface 11 of the primary chip 1 is a semiconductor substrate surface of the primary chip 1 on the side of an active surface region formed with a functional device such as a transistor, and covered with a surface protective film such as of silicon nitride. A plurality of pads 12 for external connection are provided, as exposed from the surface protective film, in a peripheral portion of the surface 11 of the primary chip 1 of a generally rectangular plan shape. The external connection pads 12 are connected to a lead frame 14 via bonding wires 13. A plurality of bumps B1 and surface interconnections W1 electrically connected to internal interconnections are provided on the surface protective film.

The secondary chip 2 is comprised, for example, of a silicon chip. The secondary chip 2 has a surface 21 which is a semiconductor substrate surface thereof on the side of an active surface region formed with a functional device such as a transistor, and covered with a surface protective film of silicon nitride. A plurality of bumps B2 and surface interconnections W2 connected to internal interconnections are provided on the surface protective film.

The secondary chip 2 is bonded to the primary chip 1 with its surface 21 opposed to the surface 11 of the primary chip 1 by a so-called face-down bonding. The bumps B2 and surface interconnections W2 of the secondary chip 2 are connected to the corresponding bumps B1 and surface interconnections W1 of the primary chip 1. Thus, the secondary chip 2 is electrically connected to the primary chip 1 in a predetermined spaced relation with respect to the surface 11 of the primary chip 1.

Figure 6:
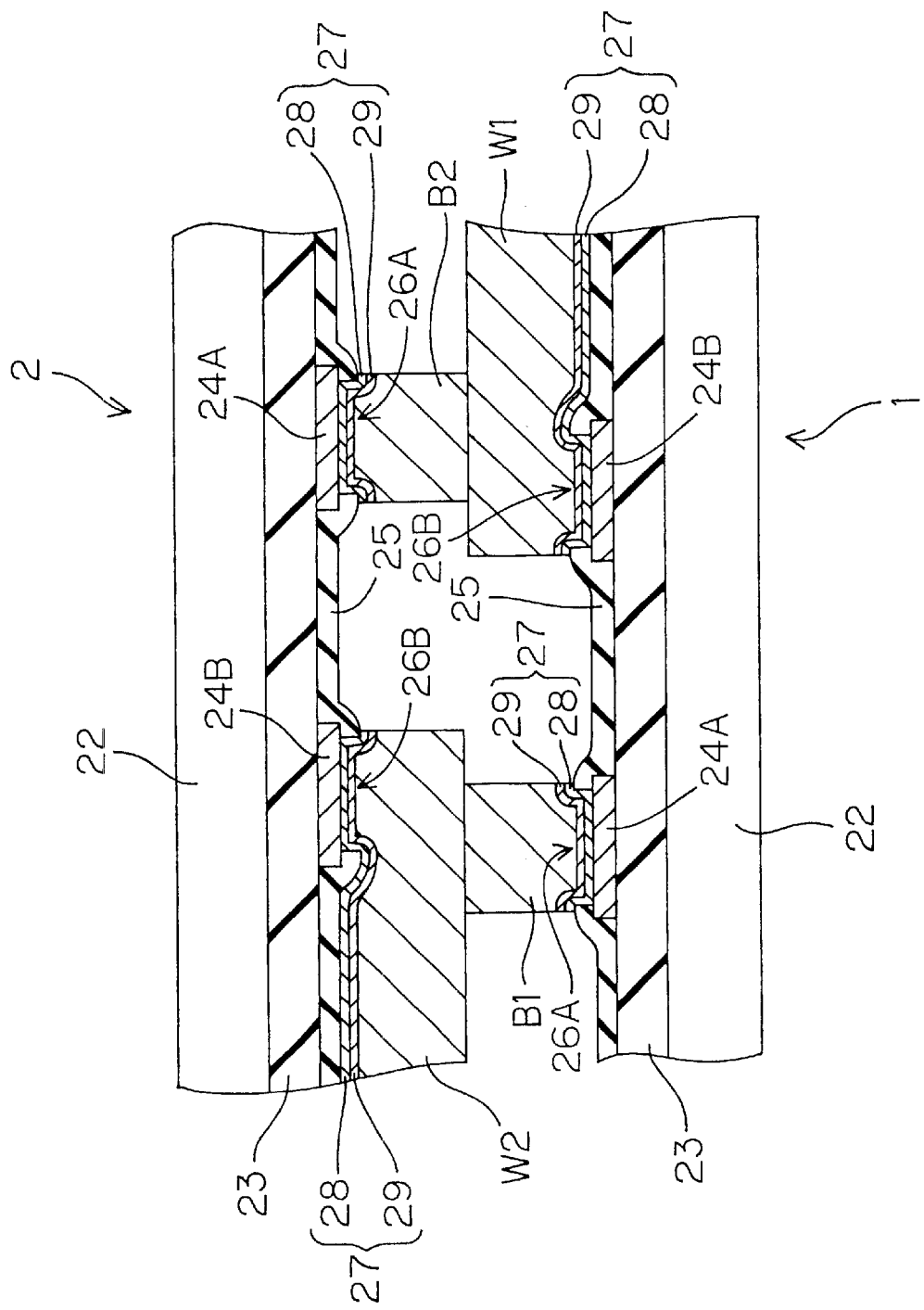
FIG. 6 is a sectional view illustrating the constructions of a primary chip and a secondary chip in the fifth embodiment on a greater scale.

FIG. 6 is a sectional view illustrating the constructions of the primary chip 1 and the secondary chip 2 on a greater scale. Since the bumps B1 and surface interconnections W1 of the primary chip 1 respectively have the same constructions as the bumps B2 and surface interconnections W2 of the secondary chip 1, an explanation will herein be given only to the secondary chip 2. In FIG. 6, components of the primary chip 1 are denoted by the same reference characters as the corresponding components of the secondary chip 2.

A field oxide film 23 such as of silicon oxide is provided on a semiconductor substrate 22 of the secondary chip 2, and internal interconnections 24A, 24B are provided on the field oxide film 23. The field oxide film 23 and the interconnections 24A, 24B are covered with a surface protective film 25 having an insulative property. The surface protective film 25 is formed with pad openings 26A and 26B, which face the interconnections 24A and 24B, respectively.

Examples of usable materials for the internal interconnections 24A, 24B include aluminum, alloys of aluminum and silicon, alloys of aluminum, silicon and copper, alloys of aluminum and copper, and copper. Examples of usable materials for the surface protective film 25 include silicon oxide, silicon nitride, silicon fluoride, and SiON.

The bumps B2 are each composed of an oxidation-resistant metal, and project from a surface portion of the internal interconnection 24A exposed through the pad opening 26A. On the other hand, the surface interconnections W2 are each formed of the same material as the bumps B2 on the surface protective film 25. The surface interconnections W2 each project above the pad opening 26B and extend on the surface of the surface protective film 25. Examples of the oxidation-resistant metal include gold, lead-based alloys, platinum, silver, palladium, iridium and alloys containing any of these metals.

The bumps B2 and the surface interconnections W2 an be formed in the same process step. More specifically, he pad openings 26A, 26B are formed in the surface protective film 25, and then a seed film 27 is formed, for example, by sputtering on the surface protective film 25 formed with the pad openings 26A, 26B and the surface portions of the internal interconnections 24A, 24B exposed from the surface protective film 25 through the pad openings 26A, 26B. After a resist film is formed on a portion of the seed film 27 where the pad openings 26A, 26B are not present therebelow and the surface interconnections W2 are not to be formed thereon, the resulting surface is subjected to plating with the use of the material for the bumps B2 and the surface interconnections W2. Subsequently, the resist film on the seed film 27 is removed, and then the portion of the seed film 27 exposed as a result of the removal of the resist film is removed. Thus, the bumps B2 and the surface interconnections W2 which have substantially the same height can be produced.

Where the bumps B2 and the surface interconnections W2 are composed of Au (gold), for example, the seed film 27 is formed by depositing a TiW (titanium tungsten) film on the surface protective film 25 by sputtering and then depositing an Au film 29 on the TiW film 28 by sputtering.

In accordance with this embodiment, as described above, the surface interconnections W1, W2 connected to the internal interconnections 24B via the pad openings 26B are provided on the primary chip 1 and the secondary chip 2, respectively. The electrical connection between the primary chip 1 and the secondary chip 2 can be achieved by connecting the surface interconnections W1 to the corresponding bump B2 and surface interconnection W2 of the secondary chip 2 and connecting the surface interconnections W2 to the corresponding bump B1 and surface interconnection W1 of the primary chip 1. Therefore, the pad openings 26B of the primary chip 1 can be located in positions independent of the positions of the pad openings 26A, 26B of the secondary chip 2 and, similarly, the pad openings 26B of the secondary chip 2 can be located in positions independent of the positions of the pad openings 26A, 26B of the primary chip 1. This increases flexibility in layout of the internal interconnections 24A, 24B and functional devices of the primary chip 1 and the secondary chip 2 thereby to allow for size reduction and higher integration of the semiconductor device.

Although the surface interconnections W1, W2 are connected only to the internal interconnections 24B in this embodiment, the surface interconnections W1, W2 may be formed so as to connect the internal interconnections 24A and 24B to each other. In this case, the following effects can be provided.

It is herein assumed that an additional internal interconnection was provided above the internal interconnections 24A, 24B thereby to connect the internal interconnections 24A and 24B to each other (multi-level interconnection). In such a case, the thickness of the additional internal interconnection could not be increased for suppression of an increase in the chip thickness, so that the additional internal interconnection would have a relatively high resistance. On the contrary, the surface interconnections W1, W2 have substantially the same height as the bumps B1, B2 and, hence, have a relatively small resistance. With the internal interconnections 24A and 24B being connected to each other by the surface interconnections W1, W2, the primary chip 1 and/or the secondary chip 2 have an excellent energy saving property without an increase in the chip thickness.

The surface interconnections W1, W2 are composed of the oxidation-resistant metal material and, hence, are not susceptible to corrosion which may otherwise occur due to oxidation thereof. This obviates the need for provision of a protective film for protecting the surface interconnections W1, W2, thereby reducing the number of process steps as compared with the case where the multi-level interconnection structure is employed to increase the number of internal interconnections.

Although the bumps B1, B2 and the surface interconnections W1, W2 are composed of the same material in this embodiment, the bumps B1, B2 and the surface interconnections W1, W2 may be composed of different materials. In this case, the formation of the surface interconnections W1, W2 and the formation of the bumps B1, B2 are achieved in different process steps.

Figure 7A:
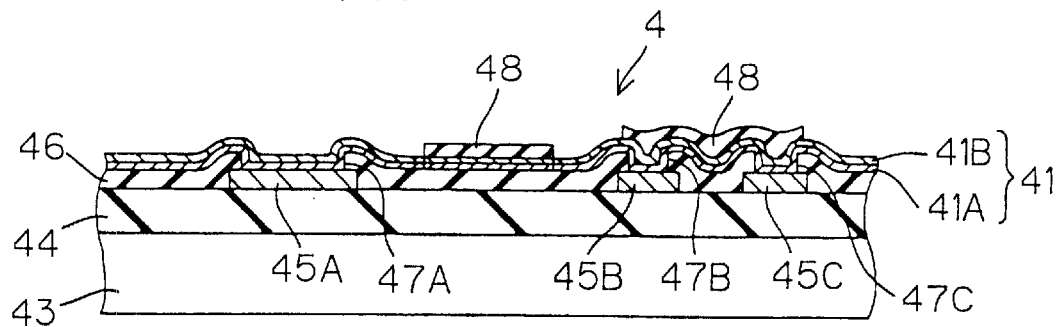
FIGS. 7A, 7B and 7C are sectional views for explaining the construction of a semiconductor chip and a production process therefor according to a sixth embodiment of the present invention.
Figure 7B:
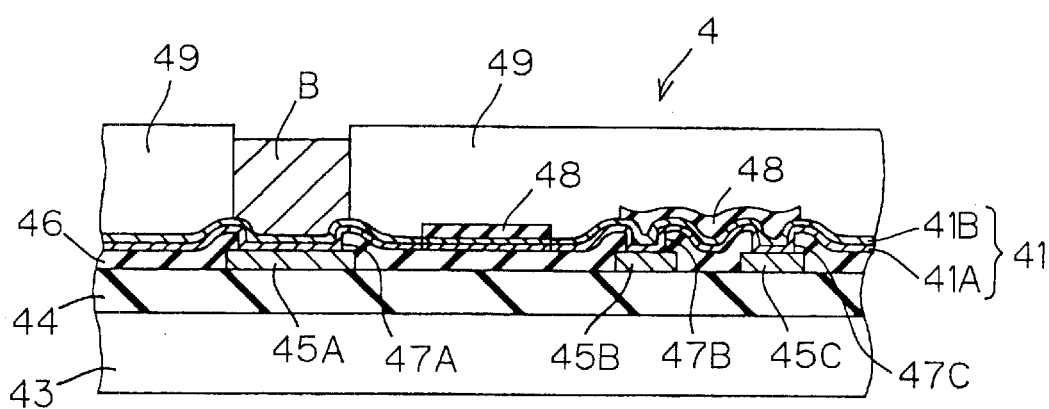
Figure 7C:
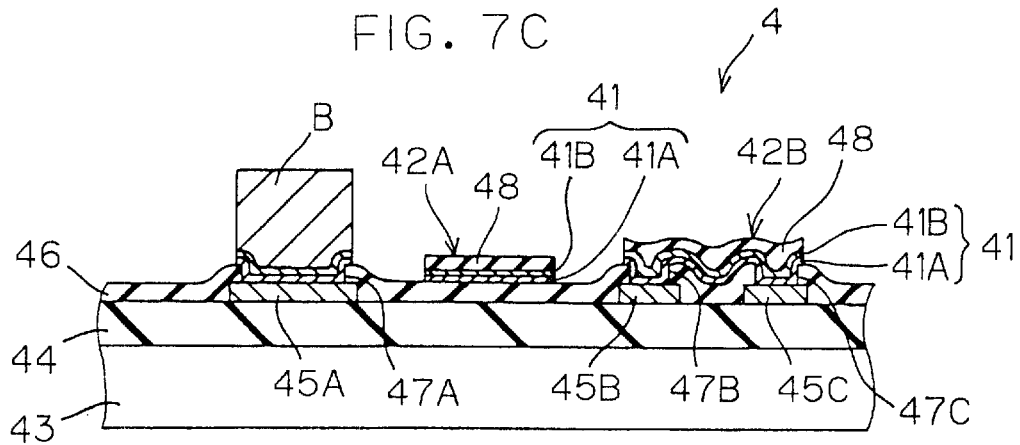

FIGS. 7A, 7B and 7C are sectional views for explaining the construction of a semiconductor chip and a production process therefor in accordance with a sixth embodiment of the present invention.

In this embodiment, surface interconnections 42A, 42B are formed from a seed film 41 which is deposited on a surface of a semiconductor chip 4 for formation of a bump B.

Referring to FIG. 7C, more specifically, a field oxide film 44 such as of silicon oxide is provided on a semiconductor substrate 43 which is a base body of the semiconductor chip 4. Internal interconnections 45A, 45B, 45C are provided on the field oxide film 44. The field oxide film 44 and the internal interconnections 45A, 45B, 45C are covered with a surface protective film 46 having an insulative property. The surface protective film 46 is formed with pad openings 47A, 47B and 47C, which face the internal interconnections 45A, 45B and 45C, respectively. The bump B of an oxidation-resistant metal (e.g., gold, a lead-based alloy, platinum, silver, palladium, iridium, or an alloy of any of these metals) is provided on the pad opening 47A. The surface interconnection 42A is provided on the surface protective film 46. The surface interconnection 42B is connected to the internal interconnection 45B via the pad opening 47B and to the internal interconnection 45C via the pad opening 47C.

When the bump B and the surface interconnections 42A, 42B are formed, the pad openings 47A, 47B, 47C are formed in the surface protective film 46, for example, by the photolithography technique, as shown in FIG. 7A. In turn, the seed film 41 of an oxidation-resistant material is formed on the surface protective film 46 formed with the pad openings 47A, 47B, 47C, for example, by sputtering. Then, patterning films 48 such as of silicon oxide, silicon nitride, silicon fluoride, SiON or SiOF are formed on portions of the seed film 41 which are to be left so as to form the surface interconnections 42A, 42B.

Thereafter, as shown in FIG. 7B, a resist film 49 is formed on a portion of the seed film 41 which does not face the pad opening 47A, and then the resulting surface is subjected to plating with the use of a material for the bump B. Thus, the bump B is formed on a portion of the seed film 41 exposed from the pad opening 47A as projecting above the pad opening 47A.

Subsequently, the resist film 49 on the seed film 41 is removed. Then, the seed film 41 is etched by using the patterning films 48 as a mask. Where the seed film 41 is comprised of a laminate of a TiW (titanium tungsten) film 41A and an Au (gold) film 41B, the Au (gold) film 41B is etched with an agent such as an aqueous solution of iodine/potassium iodide (KI/I), and then the titanium tungsten film 41A is etched with an agent such as hydrogen peroxide. Thus, the surface of the bump B is slightly etched, and a portion of the seed film 41 where the bump B and the patterning films 48 are not formed thereon is removed. Thus, the bump B and the surface interconnections 42A, 42B are formed (see FIG. 7C).

The patterning films 48 on the surface interconnections 42A, 42B may be removed after the etching of the seed film 41 or left as it is.

In accordance with this embodiment, the formation of the surface interconnections 42A, 42B can be achieved by selectively removing the seed film 41 which has been used for the formation of the bump B. This eliminates the need for separately preparing the material for the surface interconnections 42A, 42B. Therefore, a cost increase due to the provision of the surface interconnections 42A, 42B can be suppressed.

Since the seed film 41 constituting the surface interconnections 42A, 42B are composed of the oxidation-resistant material, the surface interconnections 42A, 42B are not susceptible to corrosion which may otherwise occur due to oxidation thereof. This obviates the need for provision of a protective film for protecting the surface interconnections 42A, 42B, thereby reducing the number of process steps as compared with the case where the multi-level interconnection structure is employed to increase the number of internal interconnections.

The formation of the surface interconnections 42A, 42B may be achieved by photolithographically selectively removing the portion of the seed film 41 exposed as a result of the removal of the resist film 49 after the formation of the bump B without the formation of the patterning films 48. Where the bump B has a greater height (e.g., about 10 im), however, precise patterning of the seed film 41 is difficult. Therefore, it is preferred to form the patterning films 48 on the seed film 41 before the formation of the bump B as in this embodiment.

While six embodiments of the present invention have thus been described, it should be understood that the invention be not limited to these embodiments. Although the primary chip and the secondary chip are each comprised of a silicon chip in the embodiments described above, semiconductor chips of any other semiconductor materials such as gallium arsenide compound semiconductor and germanium semiconductor may be employed. The primary chip and the secondary chip may be composed of the same semiconductor material or different semiconductor materials.

The surface interconnections may be provided on both the primary chip and the secondary chip, but may be provided only on one of the primary chip and the secondary chip. In this case, the surface interconnection of the one chip is connected to the bump of the other chip for bonding the chips to each other on a chip-on-chip basis. Further, the bumps and surface interconnections of one of the primary chip and the secondary chip may be formed as metal films (e.g., deposition films) which have a smaller height than the bumps.

While the present invention has been described in detail by way of the embodiments thereof, it should be understood that the foregoing disclosure is merely illustrative of the technical principles of the present invention but not limitative of the same. The spirit and scope of the present invention are to be limited only by the appended claims.

This application claims priority benefits under 35 USC Section 119 on the basis of Japanese Patent Applications No.

11-29843 and No. 11-29844 filed to the Japanese Patent Office on Feb. 8, 1999, the disclosure thereof being incorporated herein by reference.

What is claimed is:

1. A semiconductor chip, comprising:
   a semiconductor substrate;
   a surface protective film covering the semiconductor substrate; and
   an interconnection having a portion exposed on the surface protective film, at least the exposed portion of the interconnection being composed of an oxidation-resistant metal material, wherein the interconnection includes:
   an internal interconnection at least partly exposed from the surface protective film; and
   a metal coating film of the oxidation-resistant metal material covering a surface portion of the internal interconnection exposed from the surface protective film,
   wherein the internal interconnection projects from a surface of the surface protective film,
   wherein the metal coating film covers the surfaces of the internal interconnection projecting from the surface protective film and
   wherein the surface portion covered by the metal coating film includes sidewall surfaces of the internal interconnection so that the exposed portion of the internal interconnection is entirely covered.

2. A semiconductor device of chip-on-chip structure, comprising:
   a first semiconductor chip having a pad opening formed in a surface thereof for partly exposing an internal interconnection thereof;
   a second semiconductor chip stacked on the first semiconductor chip and bonded to the surface of the first semiconductor chip, the second semiconductor chip having a pad opening formed in a surface thereof opposed to the first semiconductor chip for partly exposing an internal interconnection thereof;
   a surface interconnection electrically connected to the internal interconnection of the first semiconductor chip through the pad opening of the first semiconductor chip; and
   an interconnection connector connecting the surface interconnection to the internal interconnection of the second semiconductor chip exposed through the pad opening of the second semiconductor chip,
   wherein the interconnection connector connects a portion other than just above the pad opening of the surface interconnection to the internal interconnection of the second semiconductor chip and the pad openings on the first and second semiconductor chips are not aligned with each other so that the surface interconnection and the interconnection connector connect the internal interconnections exposed from such non-aligned pad openings.

3. A semiconductor device as set forth in claim 2, wherein the interconnection of the first semiconductor chip is a surface interconnection of the oxidation-resistant metal material provided on the surface protective film.

4. A semi-conductor device of chip-on-chip structure as set forth in claim 2, wherein the interconnection connector includes a bump formed on a pad opening.

5. A semi-conductor device of chip-on-chip structure as set forth in claim 2, wherein the interconnection connector includes another surface interconnection formed on the surface of the second semiconductor chip.

* * * * *